United States Patent [19]

Chiu

[11] 4,216,531
[45] Aug. 5, 1980

[54] FINITE FIELD MULTIPLIER

[75] Inventor: Sou-Hsiung J. Chiu, Eagan, Minn.

[73] Assignee: Control Data Corporation, Minneapolis, Minn.

[21] Appl. No.: 961,801

[22] Filed: Nov. 17, 1978

[51] Int. Cl.² ............................................... G06F 7/52
[52] U.S. Cl. .................................................. 364/757
[58] Field of Search ................ 364/754, 757, 758, 759

[56] References Cited
U.S. PATENT DOCUMENTS 4,037,093  7/1977  Gregg et al. ..................... 364/757

Primary Examiner—Jerry Smith
Attorney, Agent, or Firm—William J. McGinnis, Jr.

[57] ABSTRACT

A multiplier for use with polynomials in an error correction system wherein the multiplier and multiplicand are first encoded from m bits to N bits, where N is greater than m, and wherein the multiplication is accomplished on a bit basis by arrays of AND gates and where the resultant product is decoded from R bits to S bits where S is less than R.

1 Claim, 1 Drawing Figure

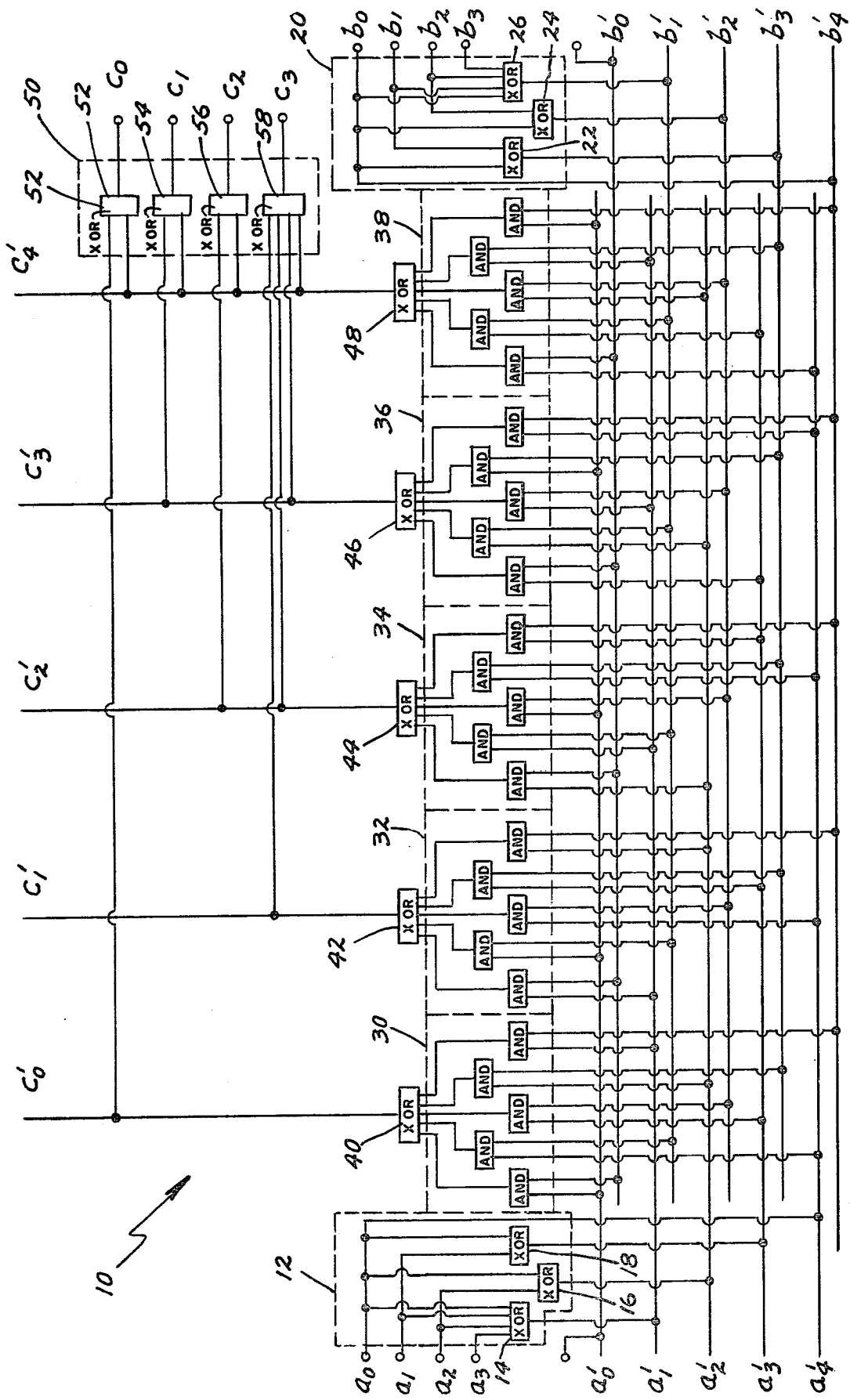

FINITE FIELD MULTIPLIER

BACKGROUND OF THE INVENTION

This invention relates to digital multipliers as used in the field of error correction techniques. More particularly this invention relates to the multiplication of polynomials representing finite fields such that the system of error correcting constrains the numbers to be multiplied in certain ways so as to influence the resulting hardware implemented multiplier.

SUMMARY OF THE INVENTION

With respect to the multiplication of two binary sequences certain properties have been observed. Thus, it has been determined that if a pair of binary numbers, having certain properties, is to be multiplied, the numbers are transformed to a longer binary sequence, one of which is an inverse, and the hardware multiplication network is simplified.

Thus a particular binary network for multiplication has been invented where the binary inputs are transformed by an encoding network and in which the product is decoded to produce the output resultant.

The encoding circuits may be an array of Exclusive OR gates for both inputs, one of which forms an inverse in the transform process. The multiplier circuit appears for ease of understanding as a matrix like network having AND gates coupled to it. Exclusive OR gates are coupled to the AND gates to form an intermediate resulting product. Finally, further Exclusive ORs decode or transform the intermediate result to a final product.

IN THE FIGURES

The single drawing FIGURE is a schematic circuit diagram showing an embodiment of the present invention for multiplication of four bit binary numbers of a particular type.

DESCRIPTION OF THE PREFERRED EMBODIMENT

Let $GF(2^4)$ represent a finite field with ($2^4=$) 16 elements, each of which can be represented by a byte of four binary digits. These entities of four-bit-bytes can be taken either as vectors or as polynomials over the binary field that has only two elements, namely, 0 and 1. To facilitate the algebraic manipulation, $$A = a_0 + a_1 x + a_2 x^2 + a_3 x^3$$

where $a_0, a_1, a_2,$ and $a_3$ assume either 0 or 1. Occasionally, however, the vector $(a_0, a_1, a_2, a_3)$ or its transpose will be used for convenience to refer to A.

With an appropriately chosen primitive or irreducible polynomial $M(x)$, e.g., $x^4 + x + 1$, we can picture our finite field $GF(2^4)$ as the residual class of all polynomials, with binary coefficients, module $M(x)$. Additions as well as multiplications between elements of $GF(2^4)$ can then be simply defined in terms of the wellknown arithmetic of polynomials, reduced by $M(x)$ to yield a resultant element as a polynomial of degree less than 4. Note that additions and multiplications of coefficients are understandably carried out over the binary field where the latter is just the logical "AND" operation and the former the logical "EXCLUSIVE-OR", usually abreviated "XOR" or "EOR".

The implementation of addition over $GF(2^4)$ may be accomplished with XOR operations bit-by-bit in parallel. That of multiplication can nevertheless be quite involved because, as is common, the degree of the product of two polynomials is the sum of the degrees of the multiplicants. Consequently, the process of reduction modulo $M(x)$ has to be performed more often than not. For instance, $$\begin{aligned}(x + x^2)(x + x^3) &= x^2 + x^4 + x^3 + x^5 \\ &= x^2 + (1 + x) + x^3 + (x + x^2) \bmod M(x) \\ &= 1 + x^3 \bmod M(x)\end{aligned} \quad (0)$$

The complex process of the reduction modulo $M(x)$ can however be avoided as we notice $$1 = x^{15} = (x^3)^5$$

That is, if $$r = x^3$$

then $$r^2 = x^3 + x^2$$

$$r^3 = x^3 + x$$

$$r^4 = x^3 + x^2 + x + 1 \quad (1)$$

and $$r^5 = 1$$

This provides us a transformation from a representation in terms of x into that of r with the following $$\begin{aligned} x &= r^3 + r \\ x^2 &= r^2 + r \\ x^3 &= r \\ 1 &= r^4 + r^3 + r^2 + r \end{aligned} \quad (2)$$

In order to find the product $C = AB$ where $$B = b_0 + b_1 x + b_2 x^2 + b_3 x^3$$

and $$C = c_0 + c_1 x + c_2 x^2 + c_3 x^3$$

we can first transform A into A', and B into B' based on (2) to get $$A' = a_0' + a_1' r + a_2' r^2 + a_3' r^3 + a_4' r^4$$

$$B' = b_0' + b_1' r + b_2' r^2 + b_3' r^3 + b_4' r^4$$

and perform the multiplication $C' = A'B$ $$\begin{aligned}&= (a_0'b_0') + (a_0'b_1' + a_1'b_0') r + (a_0'b_2' + a_1'b_1' + a_2'b_0') \\ &\quad r^2 + (a_0'b_3' + a_1'b_2' + a_2'b_1' + a_3'b_0') \\ &\quad r^3 + (a_0'b_4' + a_1'b_3' + a_2'b_2' + a_3'b_1' + a_4'b_0') \\ &\quad r^4 + (a_1'b_4' + a_2'b_3' + a_3'b_2' + a_4'b_1') \\ &\quad r^5 + (a_2'b_4' + a_3'b_3' + a_4'b_2') r^6 + (a_3'b_4' + a_4'b_3') \\ &\quad r^7 + (a_4'b_4') r^8\end{aligned}$$

As $r^5 = 1$, $r^6 = r$, $r^7 = r^2$, and $r^8 = r^3$, the only reduction necessary is a proper realignment. Let $$C' = c_0' + c_1' r + c_2' r^2 + c_3' r^3 + c_4' r^4$$

this means $$c_0' = a_0'b_0' + a_1'b_4' + a_2'b_3' + a_3'b_2' + a_4'b_1'$$
$$c_1' = a_0'b_1' + a_1'b_0' + a_2'b_4' + a_3'b_3' + a_4'b_2'$$

-continued $$c_2' = a_0'b_2' + a_1'b_1' + a_2'b_0' + a_3'b_4' + a_4'b_3'$$
$$c_3' = a_0'b_3' + a_1'b_2' + a_2'b_1' + a_3'b_0' + a_4'b_4'$$
$$c_4' = a_0'b_4' + a_1'b_3' + a_2'b_2' + a_3'b_1' + a_4'b_0'$$

Or in matrix form, we have $$MB' = \begin{pmatrix} a_0' & a_4' & a_3' & a_2' & a_1' \\ a_1' & a_0' & a_4' & a_3' & a_2' \\ a_2' & a_1' & a_0' & a_4' & a_3' \\ a_3' & a_2' & a_1' & a_0' & a_4' \\ a_4' & a_3' & a_2' & a_1' & a_0' \end{pmatrix} \begin{pmatrix} b_0' \\ b_1' \\ b_2' \\ b_3' \\ b_4' \end{pmatrix} = \begin{pmatrix} c_0' \\ c_1' \\ c_2' \\ c_3' \\ c_4' \end{pmatrix} = C$$

Having obtained the intermediate product C' in terms of r, we can then transform C' into C based on (1)

Therefore, in the example (0), we have have $$(x + x^2)(x + x^3)$$
$$= ((r^3 + r) + (r^2 + r))$$
$$\quad ((r^3 + r) + (r))$$
$$= (r^3 + r^2)(r^3)$$
$$= r^6 + r^5$$
$$= r + 1$$
$$= x^3 + 1$$

In fact, (1) can be put into matrix form for coefficients as $$UB' = \begin{pmatrix} 1 & 0 & 0 & 0 & 1 \\ 0 & 0 & 0 & 1 & 1 \\ 0 & 0 & 1 & 0 & 1 \\ 0 & 1 & 1 & 1 & 1 \end{pmatrix} \begin{pmatrix} b_0' \\ b_1' \\ b_2' \\ b_3' \\ b_4' \end{pmatrix} = \begin{pmatrix} b_0 \\ b_1 \\ b_2 \\ b_3 \end{pmatrix} = B \quad (1')$$

and similarly (2) as $$TA = \begin{pmatrix} 0 & 0 & 0 & 0 \\ 1 & 1 & 1 & 1 \\ 1 & 0 & 1 & 0 \\ 1 & 1 & 0 & 0 \\ 1 & 0 & 0 & 0 \end{pmatrix} \begin{pmatrix} a_0 \\ a_1 \\ a_2 \\ a_3 \end{pmatrix} = \begin{pmatrix} a_0' \\ a_1' \\ a_2' \\ a_3' \\ a_4' \end{pmatrix} = A' \quad (2')$$

The significance is that this transform T as well as its inverse U can easily be implemented in a logic network of the sort shown in the drawing FIG. 1.

This invention also provides a means to find the multiplicative inverse, which is:

Given an element $A = a_0 + a_1 x + a_2 x^2 + a_3 x^3$, to seek an element $B = b_0 + b_1 x + b_2 x^2 + b_3 x^3$, such that $$AB = (a_0 + a_1 x + a_2 x^2 + a_3 x^3)(b_0 + b_1 x + b_2 x^2 + b_3 x^3)$$
$$= 1 \bmod M(x)$$

It is necessary to transform $A = a_0 + a_1 x + a_2 x^2 + a_0 x^3$ into, based on (2'), $$A' = a_0' + a_1' r + a_2' r^2 + a_3' r^3 + a_4' r^4$$

Then a polynomial $B' = b_0' + b_1' r + b_2' r^2 + b_3' r^3 + b_4' r^4$ is proposed as an intermediate step, such that $$A'B' = (a_0' + a_1' r + a_2' r^2 + a_3' r^3 + a_4' r^4)(b_0' + b_1' r + b_2' r^2 + b_3' r^3 + b_4' r^4) = 1$$

Finally, the result $B = b_0 + b_1 x + b_2 x^2 + b_3 x^3$ can be obtained from B' with the transform (substitution (1')

To illustrate the present invention, consider the case where $a_0 = a_1 = a_3 = 1$, $a_2 = 0$. That is, determine the multiplicative inverse of $A = 1 + x + x^3$. With (2), the substitution can be made:

$$A = 1 + x + x^3$$
$$= (r + r^2 + r^3 + r^4) + (r + r^3) + r$$
$$= r + r^2 + r^4 = A'$$

or, $a_0' = a_3' = 0$ and $a_1' = a_2' = a_4' = 1$. Suppose the multiplicative inverse of A' is $B' = b_0' + b_1' r + b_2' r^2 + b_3' r^3 + b_4' r^4$, then $A'B' = (r + r^2 + r^4)(b_0' + b_1' r + b_2' r^2 + b_3' r^3 + b_4' r^4) = 1$. By expansion of the lefthand side of the equation $$b_0'r + (b_0' + b_1')r^2 + (b_1' + b_2')r^3 + (b_0' + b_2' + b_3')r^4 +$$
$$(b_1' + b_3' + b_4')r^5 + (b_2' + b_4')r^6 + b_3'r^7 + b_4'r^8 = 1.$$

Invoking the identities (2), the further substitutions can be made:

$$(b_1' + b_3' + b_4') + (b_0' + b_2' + b_4')r + (b_0' + b_1' + b_3')r^2$$
$$+ (b_1' + b_2' + b_4')r^3 + (b_0' + b_2' + b_3')r^4 = r + r^2 + r^3$$
$$+ r^4$$

This means that we have to require, for B', $$\begin{vmatrix} b_1' + b_3' + b_4' = 0 \\ b_0' + b_2' + b_4' = 1 \\ b_0' + b_1' + b_3' = 1 \\ b_1' + b_2' + b_4' = 1 \\ b_0' + b_2' + b_3' = 1 \end{vmatrix} \quad (3)$$

or in matrix form, $$\begin{pmatrix} 0 & 1 & 0 & 1 & 1 \\ 1 & 0 & 1 & 0 & 1 \\ 1 & 1 & 0 & 1 & 0 \\ 0 & 1 & 1 & 0 & 1 \\ 1 & 0 & 1 & 1 & 0 \end{pmatrix} \begin{pmatrix} b_0' \\ b_1' \\ b_2' \\ b_3' \\ b_4' \end{pmatrix} = \begin{pmatrix} 0 \\ 1 \\ 1 \\ 1 \\ 1 \end{pmatrix}$$

which is a system of five equations for five unknowns $b_0'$, $b_1'$, $b_2'$, $b_3$, $b_4'$. For solution, we perform row operations on the array $$\begin{array}{ccccc|c} 0 & 1 & 0 & 1 & 1 & 0 \\ 1 & 0 & 1 & 0 & 1 & 1 \\ 1 & 1 & 0 & 1 & 0 & 1 \\ 0 & 1 & 1 & 0 & 1 & 1 \\ 1 & 0 & 1 & 1 & 0 & 1 \end{array} \quad (4)$$

to yield, in canonical form, $$\begin{array}{ccccc|c} 1 & & & & & 0 \\ & 1 & & & & 0 \\ & & 1 & & & 0 \\ & & & 1 & & 1 \\ & & & & 1 & 1 \end{array} \quad (5)$$

to indicate that the system of equations (3) is equivalent to the following $$\begin{vmatrix} b_0' = 0 \\ b_1' = 0 \\ b_2' = 0 \\ b_3' = 1 \\ b_4' = 1 \end{vmatrix}$$

Hence, there is an intermediate step $B' = r^4 + r^3$. By inverse transform (1') then $$B' = r^3 + r^4$$
$$= (x + x^3) + (1 + x + x^2 + x^3)$$
$$= 1 + x^2 = B$$

Notice that the leftmost column of matrix (4) is merely the transpose of the vector ($a_0'$, $a_1'$, $a_2'$, $a_3'$, $a_4'$) for A'. The other columns, to the left of the vertical line, are each given by cyclically shifting the column to its left one position downward. The column to the right of the vertical line is the vector for the element 1 as $1 = r + r^2 + r^3 + r^4$. The intermediate answer B', as a column vector, can be taken directly from the column to the right of the vertical line in (5).

The findings are summarized as follows:

Given $A = a_0 + a_1x + a_2x^2 + a_3x^3$, get $A' = a_0' + a_1'r + a_2'r^2 + a_3'r^3 + a_4'r^4$ by (1). Construct the array $$\begin{array}{ccccc|c} a_0' & a_4' & a_3' & a_2' & a_1' & 0 \\ a_1' & a_0' & a_4' & a_3' & a_2' & 1 \\ a_2' & a_1' & a_0' & a_4' & a_3' & 1 \\ a_3' & a_2' & a_1' & a_0' & a_4' & 1 \\ a_4' & a_3' & a_2' & a_1' & a_0' & 1 \end{array} \quad (4')$$

With row operations, reduce the square matrix at the left to its canonical form, i.e., identity matrix if at all possible, as in the following:

$$\begin{array}{ccccc|c} 1 & & & & & c_0 & b_0' \\ & 1 & & & & c_1 & b_1' \\ & & 1 & & & c_2 & b_2' \\ & & & 1 & & c_3 & b_3' \\ & & & & & c_4 & b_4' \end{array} \quad (5')$$

When $c_4 = 1$, then $c_0 = c_1 = c_2 = c_3 = 0$ and there is an identity matrix at left. Otherwise, i.e., when $c_4 = b_4' = 0$, $c_0$, $c_1$, $c_2$, $c_3$ can be arbitrary. In either case, the multiplicative inverse B' of A' can be taken directly from the right-most column of the array (5'). That is, use the transpose of the row vector ($b_0'$, $b_1'$, $b_2'$, $b_3'$, $b_4'$) to form $$B' = b_0' + b_1'r + b_2'r^2 + b_3'r^3 + b_4'r^4 \quad (6)$$

To yield $B = b_0 + b_1x + b_2x^2 + b_3x^3$, the multiplicative inverse of $A = a_0 + a_1x + a_2x^2 + a_3x^3$, the transform (1') is applied to B' of (6).

In fact, (1') can be put in the matrix form for coefficients as $$\begin{pmatrix} 1 & 0 & 0 & 0 & 1 \\ 0 & 0 & 0 & 1 & 1 \\ 0 & 0 & 1 & 0 & 1 \\ 0 & 1 & 1 & 1 & 1 \end{pmatrix} \begin{pmatrix} b_0' \\ b_1' \\ b_2' \\ b_3' \\ b_4' \end{pmatrix} = \begin{pmatrix} b_0 \\ b_1 \\ b_2 \\ b_3 \end{pmatrix}$$

and similarly (1) as $$\begin{pmatrix} 0 & 0 & 0 & 0 \\ 1 & 1 & 1 & 1 \\ 1 & 0 & 1 & 0 \\ 1 & 1 & 0 & 0 \\ 1 & 0 & 0 & 0 \end{pmatrix} \begin{pmatrix} a_0 \\ a_1 \\ a_2 \\ a_3 \end{pmatrix} = \begin{pmatrix} a_0' \\ a_1' \\ a_2' \\ a_3' \\ a_4' \end{pmatrix}$$

The significance is that this transform as well as its inverse can easily be implemented in a logic network of the sort shown in the drawing FIGURE.

A system according to the present invention can be formed for any size multiplication where the number of operand bits m meets the test of $2^m - 1$ is divisible by m+1 to produce an integer. The present embodiment is shown for m=4 in a system $GF(2^4)$ and it will work for m=6,10,12,16,18,22,28, according to the test described.

Referring now to the single drawing FIGURE, a finite field multiplier 10 according to the present invention is shown where the system is mathematically described by the preceding discussion for a 4×4 multiplication. A four bit A operand is supplied to input terminals $a_0$, $a_1$, $a_2$, $a_3$ and enters a first input transpose network 12 which generates a five bit intermediate operand using Exclusive OR gates 14, 16 and 18. The five bit intermediate A' operand is supplied to multiplier busses $a_0'$, $a_1'$, $a_2'$, $a_3'$ and $a_4'$.

Similarly a four bit B operand is supplied to input terminals $b_0$, $b_1$, $b_2$, and $b_3$ of a second input transpose network 20. The first input transpose network 12 is similar to the second input transpose network 20. Second input transpose network 20 is comprised of Exclusive OR gates 22, 24 and 26. The output of network 20 is a five bit intermediate B' operand which is supplied to multipler busses $b_0'$, $b_1'$, $b_2'$ $b_3'$ and $b_4'$.

The contents of the ten multiplier, busses $a_0'$—$a_4'$ and $b_0'$—$b_4'$ are connected in the array shown in the FIGURE to five groups of AND gates 30, 32, 34, 36 and 38 which generate partial product bits. Exclusive OR gates 40, 42, 44, 46 and 48 connected with AND gate groups 30, 32, 34, 36 and 38 respectively decode the partial product bits and provide outputs to five product busses $c_0'$, $c_1'$, $c_2'$, $c_3'$ and $c_4'$.

The product busses are connected to an output inverse transpose network 50 which comprises Exclusive OR gates 52, 54, 56 and 58. The output of transpose network 50 is the four bit product operand C consisting of output bits $c_0$, $c_1$, $c_2$ and $c_3$ from Exclusive OR gates 52, 54, 56 and 58, respectively.

What is claimed is:

1. A finite field multiplier for forming the product of two operands A and B expressed as a plurality of binary bits, where each operand is of the same length and wherein the relationship $2^m - 1$ is divisible to form an integer by m+1 wherein m is the number of bits in said operands, wherein said multiplier comprises, means for receiving an A operand of the form $A = a_0 + a_1x + a_2x^2 + a_3x^3 + \ldots + a_{m-1}x^{m-1}$ means for receiving a B operand of the form $B = b_0 + b_1x + b_2x^2 + b_3x^3 + \ldots + b_{m-1}x^{m-1}$ a first transpose network means for transforming the A operand into the equivalent form $A' = a_0' + a_1'r + a_2'r^2 + a_3'r^3 + a_4'r^4 + \ldots + a_m'r^m$ where $r^{m+1} = x^{2m-1} = 1$ wherein said first transpose network means is comprised of Exclusive OR gates, a second transpose network means for transforming the B operand into the equivalent form $$B' = b'_0 + b'_1 r + b'_2 r^2 + b'_3 r^3 + b'_4 r^4 + \ldots + b'_m r^m$$
where $r^{m+1} = x^{2m-1} = 1$ wherein said second transpose network means is comprised of Exclusive OR gates,
- a plurality of first multiplier busses connected to receive the output of said first transpose network means,
- a plurality of second multiplier busses connected to receive the output of said second transpose network means,
- a plurality of AND gate groups connected in array form to said first and second plurality of multiplier busses,
- a plurality of product busses,
- at least one Exclusive OR gate connected to each of said AND gate groups and having an output connected to one of said product busses,
- an output inverse transpose network connected to said product busses for producing a product $$C = c_0 + c_1 x + c_2 x^2 + c_3 x^3 + \ldots + c_{m-1} x^{m-1}$$
$$= c_0' + c_1' r + c_2' r^2 + c_3' r^3 + c_4' r^4 + \ldots + c_m' r^m$$

wherein said inverse transpose network is comprised of Exclusive OR gates and the resultant product is a sequence of m bits.

* * * * *